United States Patent [19]

McNabb

[11] Patent Number: 4,885,841

[45] Date of Patent: Dec. 12, 1989

[54] VIBRATIONAL METHOD OF ALIGNING THE LEADS OF SURFACE-MOUNT ELECTRONIC COMPONENTS WITH THE MOUNTING PADS OF PRINTED CIRCUIT BOARDS DURING THE MOLTEN SOLDER MOUNTING PROCESS

[75] Inventor: John P. McNabb, Boise, Id.

[73] Assignee: Micron Technology, Inc., Boise, Id.

[21] Appl. No.: 313,221

[22] Filed: Feb. 21, 1989

[51] Int. Cl.[4] .............................................. H05K 3/34
[52] U.S. Cl. ....................................... 29/834; 29/840; 29/841; 437/9; 437/203; 437/204
[58] Field of Search .......................... 29/840, 841, 834; 437/9, 203, 204, 209

[56] References Cited

U.S. PATENT DOCUMENTS

| | | | |
|---|---|---|---|
| 2,900,701 | 8/1959 | Coggins | 437/9 |
| 3,092,521 | 6/1963 | Pohl | 437/9 |
| 3,403,438 | 10/1968 | Best et al. | 437/209 |
| 3,698,075 | 10/1972 | Boyle | 437/9 |
| 4,376,339 | 3/1983 | Ammon et al. | 29/876 |
| 4,386,464 | 6/1983 | Yanai et al. | 29/832 |
| 4,528,747 | 7/1985 | Hoffman et al. | 29/834 |

Primary Examiner—Timothy V. Eley
Assistant Examiner—K. Jordan
Attorney, Agent, or Firm—Angus C. Fox, III; Stan Protigal; Jon Busack

[57] ABSTRACT

During solder-reflow attachment of surface-mount electronic components to a printed circuit board, vibrational energy sufficient to overcome the static coefficient of friction between the leads of a component and their respective connector pads is applied to the board, with the result that the surface tension of the molten solder between the leads and the pads will produce a best-fit alignment of the leads of each component on their corresponding connector pads.

16 Claims, 4 Drawing Sheets

VIBRATIONAL METHOD OF ALIGNING THE LEADS OF SURFACE-MOUNT ELECTRONIC COMPONENTS WITH THE MOUNTING PADS OF PRINTED CIRCUIT BOARDS DURING THE MOLTEN SOLDER MOUNTING PROCESS

FIELD OF THE INVENTION

This invention relates to printed circuit board component mounting techniques, and more specifically, to a method for aligning the leads or terminals of surface-mount components with their corresponding mounting pads on a printed circuit board during the soldering process.

BACKGROUND OF THE INVENTION

Integrated semiconductor devices are typically constructed en masse on a wafer of silicon or gallium arsenide. Each device generally takes the form of an integrated circuit (IC) die, which is bonded to the die-mounting paddle of a leadframe. The wire attachment pads on the die are connected with their corresponding leads on the leadframe with aluminum or gold wire during a wire bonding process. The die and leadframe are then encapsulated in a plastic or ceramic package, which is then recognizable as an IC "chip". IC chips come in a variety of forms such as dynamic random access memory (DRAM) chips, static random access memory (SCRAM) chips, read only memory (ROM) chips, gate arrays, and so forth. The chips are interconnected in myriad combinations on printed circuit boards, along with the other types of discrete components such as resistors and capacitors, by any number of techniques, such as socketing and soldering.

For very high-temperature applications, components may be welded to traces on circuit boards. However, for most applications, components are soldered to circuit boards. The term solder refers to the soft metal alloy which is commonly used to join or fuse the surfaces of other metals or alloys having much higher melting points. Typically tin-lead alloys are utilized for electronics assembly purposes. There are two principal soldering techniques currently used for the attachment of components to circuit boards. The first is the soldered through-hole technique, whereby components are mounted on the top surface of a circuit board, with the leads of the components extending through metal-plated through-holes in the board which are of slightly larger diameter than the leads. The board is then subjected to a wave-soldering process. During the wave soldering process, solder is drawn by capillary action into the clearances between the leads and the through-hole walls. When the solder is allowed to solidify, the leads are securely soldered within the through-holes. The second principal soldering technique for attaching components to a circuit board is the surface-mount process.

The surface-mount soldering technique is utilized, for example, in the assembly of the Single Inline Memory Module (SIMM) depicted in a partially-assembled state in the top plan view of FIG. 1. The module, when complete, comprises 9 DRAM chips, D1 through D9, and 9 decoupling capacitors, C1 through C9, all of which are surface mounted to the printed circuit board 11. As a space-saving measure, each of the 9 decoupling capacitors is surface-mounted beneath one of the DRAM chips. Referring now to both FIGS. 1 and 2, each of the DRAM chips has 18 J-shaped leads which are soldered, at infrared-energy-generated temperatures of approximately 215 degrees Centigrade, to 18 chip-connector pads 13 on circuit board 11 beneath each chip. Each of the decoupling capacitors is also infrared soldered to corresponding pair of capacitor connector pads 15. The soldering of the DRAM chips and the capacitors is performed in a single heating operation. In the view of FIG. 1, the left-most DRAM chip has been removed, exposing one of the 9 sets of 18 chip-connector pads, as well as one of the 9 decoupling capacitors. In addition, the right-most DRAM chip and the decoupling capacitor beneath it have been removed, exposing a second set of chip-connector pads 13 and one of the 9 pairs of capacitor connector pads 15.

Prior to the attachment of the components to the board, the leads of the DRAM chips 21 and the capacitor terminals are tinned with 63-37 solder and the mounting pads on the printed circuit board are screen printed with a paste comprised of soldering flux and powdered 63-37 solder. The individual components are then positioned on the circuit board 11 so that, as nearly as practicable, the leads (the term "surface-mount leads" is used herein to refer both to surface-mount leads and terminals) of the components are located directly on top of their respective mounting pads. Once the components are thus positioned, the board-component assemblies are sent through an infrared oven and subjected to increasing temperatures similar to those recorded on the temperature vs. time graph of FIG. 3. At a temperature of approximately 183 degrees Centigrade, the solder plating (tinning) on the leads and the powdered solder on the pads melt. In order to assure that the solder on the leads and pads completely melts and fuses, the oven temperature is allowed to peak at 215 degrees Centigrade. The use of a temperatures greater than 215 degrees does not improve solder reflow for the particular solder alloy used and may decrease the reliability of the board's electronic components. When the assembly is allowed to cool, the leads or terminals of the components are firmly soldered to the connector pads. Proper alignment of the components is critical, since optimum connection of the components to the board will occur only if each lead or terminal is centered on its corresponding pad; poor alignment of components may result in an open circuit or a high-resistance connection.

SUMMARY OF THE INVENTION

It was serendipitously discovered that if the trays, in which the board-component assemblies were transported through the infrared oven, were tapped during solder reflow (the period when the solder joints on the board are in a molten state), the surface tension of the solder between each lead and its corresponding pad induced what might be termed a "best-fit" centering of a component's leads on their corresponding pads. Of course, a component's leads must be sufficiently aligned with their corresponding pads so that solder surface tension will exert a force on the leads. Rough alignment within the tolerances of contemporary pick-and-place is essential, as the vibrational alignment process will not cure gross misalignments. Alignment of the component leads with their respective connector pads during reflow must occur while the solder is completely molten. Any attempt to align the leads while the solder is resolidifying will result in less reliable connections of greater resistance. This fact mandates that only component-board assemblies, which are all well within the solder reflow temperature range, should be vibrated simultaneously. The mesh trays, which were originally utilized for conveying the component-board assemblies through the infrared oven, were so long that assemblies at one end were being subjected to a much different temperature than those at the other. Once the alignment phenomenon became better understood, the reflow procedure was modified so that a small group of SIMM boards were loaded into one end of each tray. As a group passed through approximately the hottest point in the oven, the empty end of the mesh tray, which had already exited the oven, was lightly strummed with a metal pick. Although this procedure produced satisfactory results, the process has been refined with the development of a more uniform, less labor-intensive technique for vibrating component-board assemblies during solder reflow.

PREFERRED EMBODIMENT OF THE INVENTION

As previously explained, it was determined that a solder reflow vibrational alignment system should vibrate a component-board assembly only when the solder is completely molten. Therefore, the vibrational alignment system, which constitutes the preferred embodiment of the invention, has been designed to vibrate a single component-board assembly only during the period that it is passing through the region of highest temperature within the infrared reflow oven.

Figure 1:
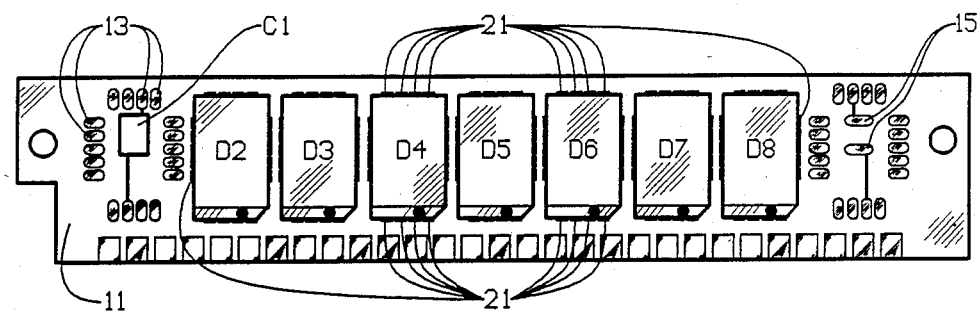
FIG. 1 is a top plan view of a partially-assembled Single Inline Memory Module (SIMM)
Figure 2:
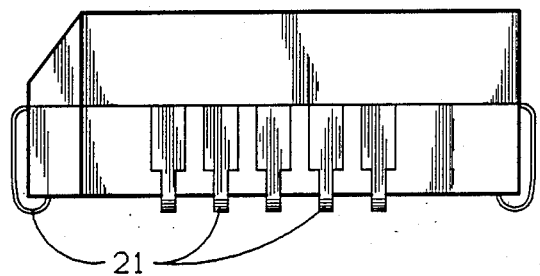
FIG. 2 is a right side elevational view of one of the DRAM chips used on the SIMM of FIG. 1.
Figure 3:
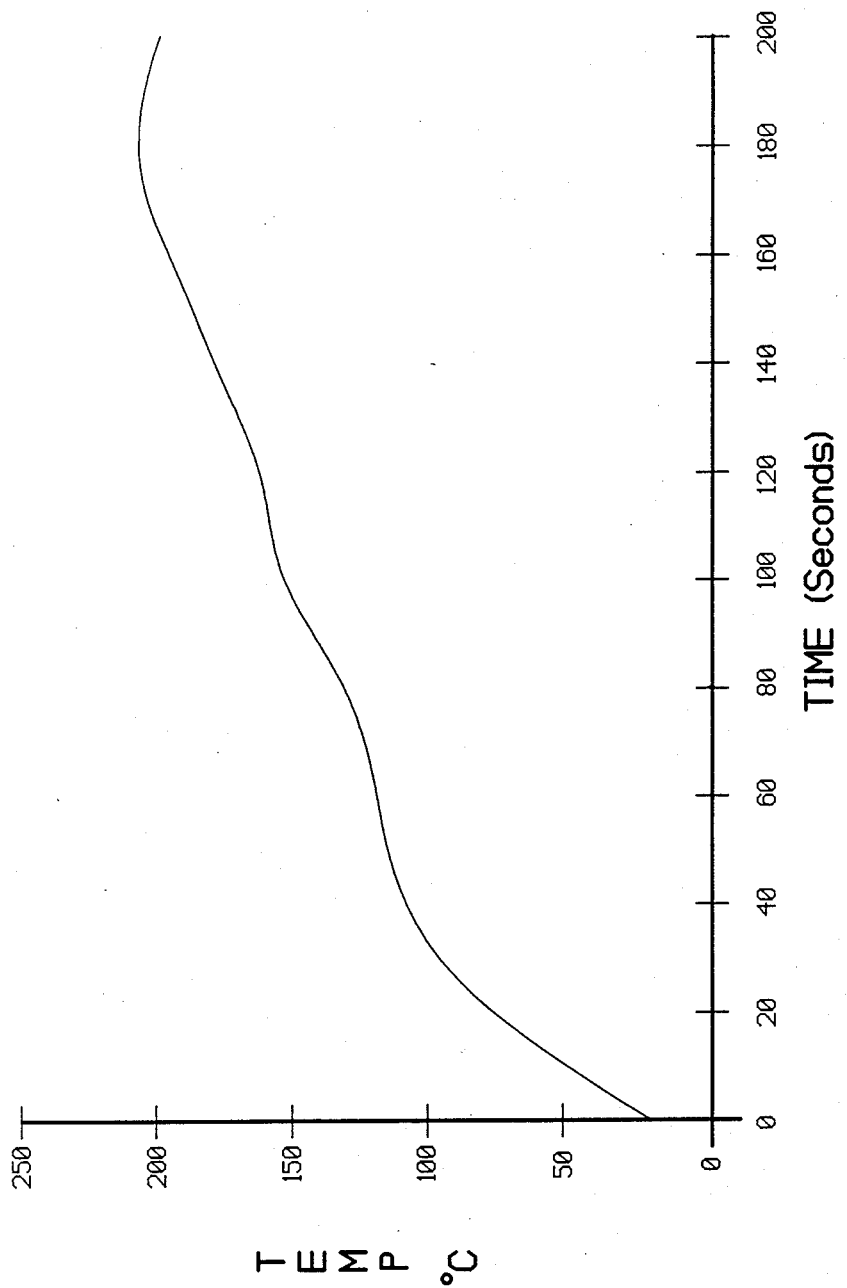
FIG. 3 is a graph of a typical temperature vs. time graph for a typical infrared solder-reflow process.
Figure 4:
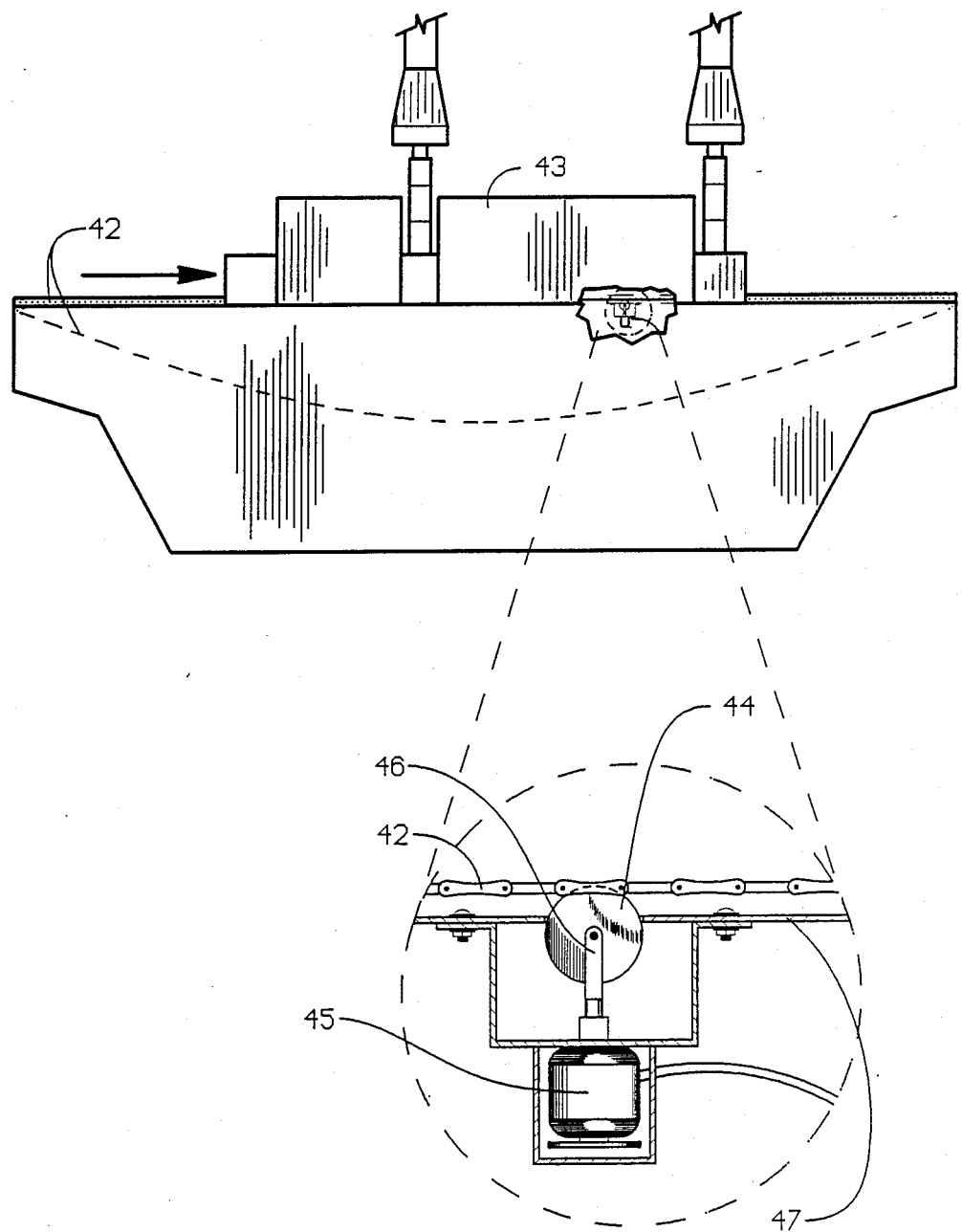
FIG. 4 is a side elevational schematic diagram of an infrared oven and chain conveyor system, depicting a mechanical technique for vibrating component-board assemblies during solder reflow.
Figure 5:
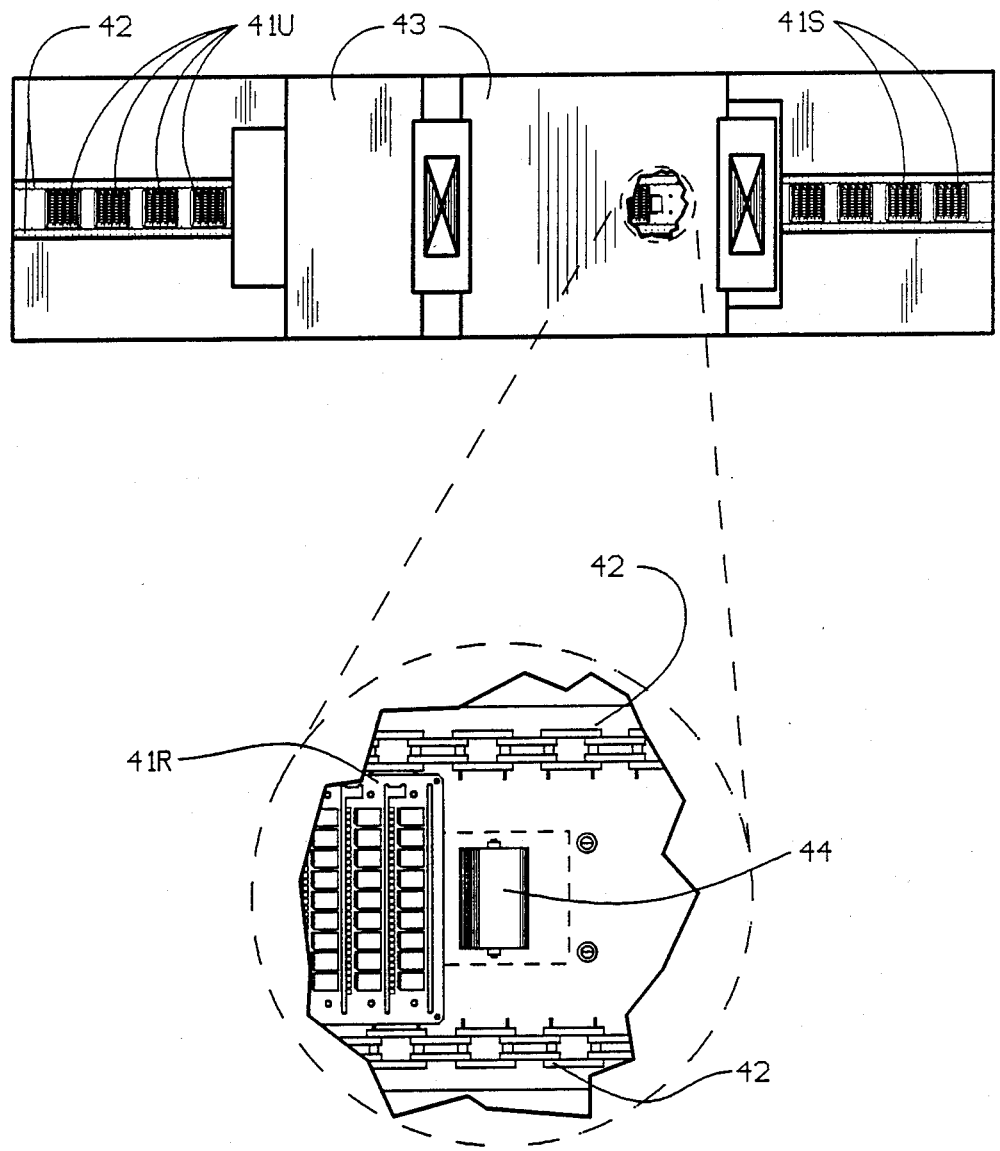
FIG. 5 is a top plan schematic diagram of the infrared oven and chain conveyor system of FIG. 4A, showing four unsoldered component-board assemblies entering the oven and four soldered component-board assemblies exiting the oven on the chain conveyor system.

Referring now to the mechanical schematic of FIGS. 4A and 4B, unsoldered component-board assemblies 41U are loaded individually onto a moving chain conveyor 42. Small component-board assemblies, such as the SIMM of FIG. 1, can be manufactured in a multi-board panel which can be cut into individual boards following solder reflow. The track conveyor transports the unsoldered assemblies 41U through an infrared reflow oven 43. At a point corresponding to the region within the oven of greatest temperature, a cylindrical roller 44, the axis of which is vibrating in a vertical plane at a frequency in the 20 to 60 hertz range with an amplitude of 0.04 to 0.08 mm range, is positioned below the level of chain conveyor 42 such that as a solder-reflowed component-board assembly 41R passes over and in contact with roller 44, the full amplitude of the vibration is transmitted to the solder-reflowed component-board assembly 41R. Vibrational energy to roller 44 is supplied by an electro-mechanical vibrator 45 located beneath the floor 46 of oven 43. A mechanical link 46 extending through the floor 46 of oven 43 couples roller 44 to the vibrator 45. As energy from roller 44 is transmitted to the board 41R and then to the components, intermittently reducing the static coefficient of friction between the component leads and their corresponding connector pads, the surface tension of the solder between those same leads and pads causes the chip to position itself on the pads in a position of minimum potential energy. This position of minimum potential energy essentially corresponds to a best-fit centering of the leads of a chip on their corresponding pads. As soon as the component-board assembly has passed completely over vibrating roller 44, the transmittal of vibrational energy to the broad 41R ceases. The chain conveyor 42 continues to transport the component-board assembly outside the oven and, as the assembly cools to room temperature, the solder between the component leads and their respective pads solidifies, with the best-fit position being retained. Soldered boards 41S are shown exiting oven 43.

Somewhat higher vibrational frequencies at lower amplitudes are also capable of producing surface-tension induced component alignment. However, as the vibrational frequency increases, complete coupling of vibrational energy does not occur since roller 44 is never mechanically attached to a solder-reflowed component-board assembly 41R (it is merely resting on the roller). At some point, as the vibrational frequency is increased, the inertial effect will prevent the solder-reflowed component-board assembly 41R from following the movements of the roller 44. Hence, it is deemed desirable to maintain the vibrational frequency below the 60 hertz range, since the energy transfer to the component-board assemblies is optimized and, hence, more controllable.

Although the preferred embodiment of the invention employs mechanical means to transmit vibrational energy to the component-board assemblies, other techniques such as acoustical transmittal of vibrational energy could be employed as well and are covered by the scope and spirit of the following claims.

I claim:

1. A method of solderably attaching the leads of surface-mount electronic components to the connector pads on a printed circuit board such that the leads of each component are positioned in a best-fit centering on their corresponding mounting pads, comprising the steps of:

tinning the leads of the components with solder;

applying a paste comprised of flux and powdered solder to the mounting pads on the printed circuit board;

creating an unsoldered component-board assembly by positioning the components on the printed circuit board such that the leads of the components are roughly aligned with their corresponding connector pads;

heating the unsoldered component-board assembly, while in a substantially horizontal position, to a temperature sufficient to permit the solder tinning on the leads and the powdered solder in the paste to melt and fuse;

applying vibrational energy to the component-board assembly while the solder between the leads and pads is in a fused and molten state;

said vibrational energy being sufficient to overcome the static coefficient of friction between the leads of the components and their respective connector pads to a point where the surface tension of the molten solder will produce a best-fit alignment of the leads of each component on their corresponding connector pads;

said vibrational energy being less than a level which would exert forces on the components greater than those exerted on the components by the surface tension of the molten solder;

halting the application of said vibrational energy while the solder between the leads and pads is in a fused and molten state; and cooling the component-board assembly, thus allowing the solder between the leads and pads to solidfy.

2. The method of claim 1, wherein said vibrational energy is in the 20 to 60 hertz range.

3. The method of claim 2, wherein said vibrational energy has an amplitude within a range of 0.04 to 0.08 mm.

4. The method of claim 3, wherein said heating of the component-board assembly is performed in an infrared oven.

5. The method of claim 4, wherein component-board assemblies are transported through said infrared oven on a track conveyer.

6. The method of claim 5, wherein the lower surface of the component-board assembly is brought into contact with a cylindrical roller, the axis of which vibrates in a vertical plane.

7. A method of solderably attaching the leads of surface-mount electronic components to the connector pads on a printed circuit board such that the leads of each component are positioned in a best-fit centering on their corresponding mounting pads, comprising the steps of:

coating the leads of the components and the mounting pads on the printed circuit board with solder;

creating an unsoldered component-board assembly by positioning the components on the printed circuit board such that the leads of the components are roughly aligned with their corresponding connector pads;

heating the unsoldered component-board assembly, while in a substantially horizontal position, to a temperature sufficient to permit the solder on the leads and pads to melt and fuse;

applying vibrational energy to the component-board assembly while the solder between the leads and pads is in a fused and molten state;

said vibrational energy being sufficient to overcome the static coefficient of friction between the leads of the components and their respective connector pads to a point where the surface tension of the molten solder will produce a best-fit alignment of the leads of each component on their corresponding connector pads;

said vibrational energy being less than a level which would exert forces on the components greater than those exerted on the components by the surface tension of the molten solder;

halting the application of said vibrational energy while the solder between the leads and pads is in a fused and molten state; and cooling the component-board assembly, thus allowing the solder between the leads and pads to solidify.

8. The method of claim 7, wherein the solder used to coat the leads is in a fused state at the time of application.

9. The method of claim 7, wherein the solder used to coat the leads is in a powdered state at the time of application.

10. The method of claim 7, wherein the solder used to coat the pads is in a fused state at the time of application.

11. The method of claim 7, wherein the solder used to coat the pads is in a powdered state at the time of application.

12. The method of claim 7, wherein said vibrational energy is in the 20 to 60 hertz range.

13. The method of claim 12, wherein said vibrational energy has an amplitude within a range of 0.04 to 0.08 mm.

14. The method of claim 13, wherein said heating of the component-board assembly is performed in an infrared oven.

15. The method of claim 14, wherein component-board assemblies are transported through said infrared oven on a chain conveyer.

16. The method of claim 15, wherein the lower surface of the component-board assembly is brought into contact with a cylindrical roller, the axis of which vibrates in a vertical plane.

* * * * *

UNITED STATES PATENT AND TRADEMARK OFFICE
CERTIFICATE OF CORRECTION

PATENT NO. : 4,885,841
DATED : December 12, 1989
INVENTOR(S) : John P. McNabb

It is certified that error appears in the above-indentified patent and that said Letters Patent is hereby corrected as shown below:

Column 1, line 29, delete "(SCRAM)" and insert -- (SRAM) --;

Column 3, line 31, delete "4A" and insert -- 4 --;

Column 3, line 49, delete "4A and 4B" and insert -- 4 and 5 --;

Column 3, line 67, delete "46" and insert -- 47 --.

Signed and Sealed this

Eighth Day of February, 1994

Attest:

BRUCE LEHMAN

Attesting Officer    Commissioner of Patents and Trademarks